(12) United States Patent
Kuroda et al.

(10) Patent No.: US 10,613,562 B2
(45) Date of Patent: Apr. 7, 2020

(54) VOLTAGE REGULATOR INCLUDING FAULT DETECTION CIRCUIT

(71) Applicant: ABLIC Inc., Chiba-shi, Chiba (JP)

(72) Inventors: Tadakatsu Kuroda, Chiba (JP); Tsutomu Tomioka, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/249,558

(22) Filed: Jan. 16, 2019

(65) Prior Publication Data

US 2019/0265739 A1 Aug. 29, 2019

(30) Foreign Application Priority Data

Feb. 27, 2018 (JP) .................................. 2018-033433

(51) Int. Cl.
| | |
|---|---|
| *G05F 1/567* | (2006.01) |
| *H03F 3/45* | (2006.01) |
| *G05F 1/575* | (2006.01) |
| *G05F 1/569* | (2006.01) |

(52) U.S. Cl.
CPC .............. *G05F 1/567* (2013.01); *G05F 1/569* (2013.01); *G05F 1/575* (2013.01); *H03F 3/45264* (2013.01); *H03F 2200/129* (2013.01); *H03F 2200/231* (2013.01); *H03F 2203/45116* (2013.01); *H03F 2203/45206* (2013.01)

(58) Field of Classification Search
CPC ....................................................... H02M 1/56
See application file for complete search history.

(56) References Cited

U.S. PATENT DOCUMENTS

| | | | |
|---|---|---|---|
| 2015/0188423 A1* | 7/2015 | Tomioka | ................. G05F 1/571 323/282 |
| 2017/0063228 A1* | 3/2017 | Kimura | ................. H02M 3/158 |
| 2017/0201175 A1* | 7/2017 | Chen | ........................ H02M 1/08 |

FOREIGN PATENT DOCUMENTS

JP  2004-282121 A  10/2004

\* cited by examiner

*Primary Examiner* — Kyle J Moody
*Assistant Examiner* — Trinh Q Dang
(74) *Attorney, Agent, or Firm* — Brinks Gilson & Lione

(57) ABSTRACT

A voltage regulator includes a first switch connected between a first input terminal of an error amplifier circuit and an input terminal of the voltage regulator, a second switch connected between a second input terminal of the error amplifier circuit and an output terminal of the voltage regulator, a third switch connected between the first input terminal and the second input terminal, and a short fault detection circuit which detects a short fault of the output terminal, based on an output voltage of the voltage regulator.

6 Claims, 3 Drawing Sheets

PRIOR ART

VOLTAGE REGULATOR INCLUDING FAULT DETECTION CIRCUIT

RELATED APPLICATIONS

This application claims priority under 35 U.S.C. § 119 to Japanese Patent Application No. 2018-033433 filed on Feb. 27, 2018, the entire content of which is hereby incorporated by reference.

BACKGROUND OF THE INVENTION

1. Field of the Invention

The present invention relates to a voltage regulator.

2. Description of the Related Art

A voltage regulator includes a reference voltage source, an error amplifier circuit, a voltage division resistor, and an output transistor.

The error amplifier circuit compares a feedback voltage supplied from the voltage division resistor with a reference voltage of the reference voltage source and controls the gate voltage of the output transistor so that an output voltage becomes constant. In a state that the output voltage is kept constant, the feedback voltage and the reference voltage become approximately equal. That is, the voltages of inverting and non-inverting input terminals of the error amplifier circuit are approximately equal.

When the input voltages to the inverting and non-inverting input terminals of the error amplifier circuit are held different for a long time, performance deteriorates through generation of an input offset voltage, etc., since the threshold voltages of differential input transistors vary due to bias temperature instability.

FIG. 3 illustrates a circuit diagram of a conventional error amplifier circuit 300. The error amplifier circuit 300 includes PMOS transistors 301 through 303, NMOS transistors 304 and 305, and switches SW1 through SW8. In a power saving mode, the error amplifier circuit 300 turns on the switch SW1 to stop a bias voltage Vbias to turn off the PMOS transistor 301, thereby stopping the operation current, i.e., stopping its operation. Further, the error amplifier circuit 300 turns off the switches SW2 and SW3 to separate input terminals INP and INN from the PMOS transistors 302 and 303 being input transistors respectively.

Simultaneously, the error amplifier circuit 300 turns on the switches SW4 through SW8 to ground gate terminals of the PMOS transistors 302 and 303 and ground all terminals of the NMOS transistors 304 and 305. Since the respective terminals of the transistors take the same voltage in the power saving mode by adopting such a circuit configuration, the error amplifier circuit 300 prevents deterioration of the performance due to bias temperature instability (refer to, for example, Japanese Patent Application Laid-Open No. 2004-282121).

SUMMARY OF THE INVENTION

When the output terminal of the voltage regulator including the above conventional error amplifier circuit is subjected to a load short fault (supply fault or ground fault) on the normal operation, however, possibility that performance deterioration due to the bias temperature instability takes place in the PMOS transistor 303 whose gate is connected to the input terminal INN becomes high since a condition in which the voltage of the input terminal (INN, for example) supplied with the feedback voltage becomes higher or lower than the reference voltage continues.

The present invention aims to provide a voltage regulator capable of preventing deterioration of the performance due to bias temperature instability even in an operation other than in a power saving mode.

A voltage regulator according to one aspect of the present invention includes an error amplifier circuit configured to control a gate voltage of an output transistor, based on a reference voltage supplied from an input terminal and an output voltage supplied from an output terminal, a first switch connected between a first input terminal of the error amplifier circuit and the input terminal, a second switch connected between a second input terminal of the error amplifier circuit and the output terminal, a third switch connected between the first input terminal and the second input terminal, and a short fault detection circuit configured to detect a short fault of the output terminal, based on the output voltage. On and off of the first through third switches are controlled according to a detection signal supplied from the short fault detection circuit.

According to a voltage regulator of the present invention, it is possible to prevent deterioration of the performance due to bias temperature instability even in an operation other than in a power saving mode.

DETAILED DESCRIPTION OF THE PREFERRED EMBODIMENTS

Preferred embodiments of the present invention will hereinafter be described with reference to the accompanying drawings.

First Embodiment

Figure 1:
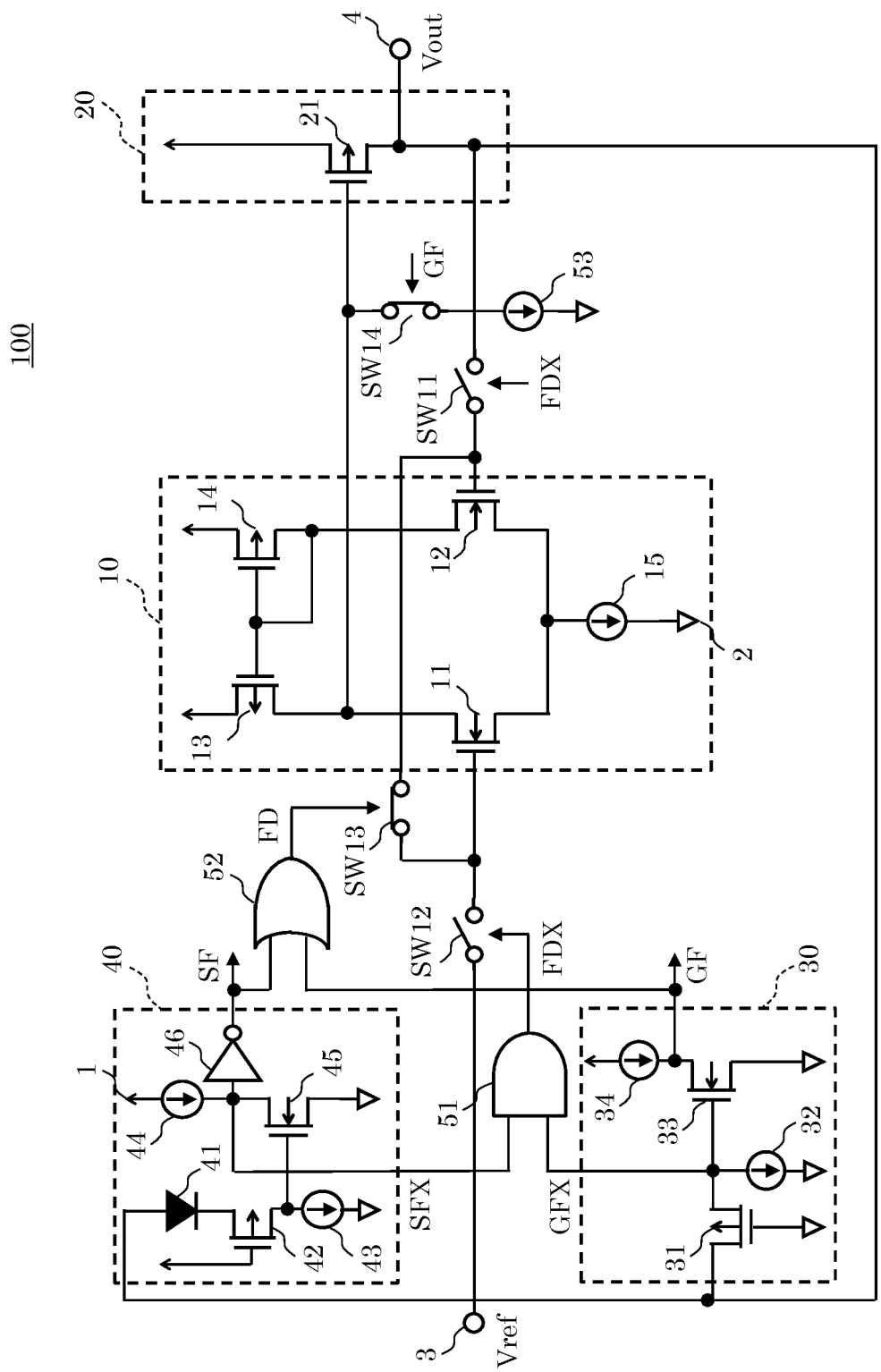
FIG. 1 is a circuit diagram illustrating a voltage regulator according to a first embodiment of the present invention.

FIG. 1 is a circuit diagram of a voltage regulator 100 according to a first embodiment of the present invention.

The voltage regulator 100 according to the present embodiment includes an error amplifier circuit 10, an output circuit 20, a ground fault detection circuit 30 which detects a ground fault of a load, a supply fault detection circuit 40 which detects a supply fault of the load, an AND circuit 51, an OR circuit 52, a current source 53, switches SW11 through SW14, a power supply terminal 1, a ground terminal 2, an input terminal 3, and an output terminal 4.

The error amplifier circuit 10 includes NMOS transistors 11 and 12 being a differential input pair, PMOS transistors 13 and 14, and a current source 15. The output circuit 20 includes a PMOS transistor 21 being an output transistor. The ground fault detection circuit 30 includes a PMOS transistor 31, current sources 32 and 34, and an NMOS transistor 33. The supply fault detection circuit 40 includes a diode 41, a PMOS transistor 42, current sources 43 and 44, an NMOS transistor 45, and a NOT circuit 46.

The error amplifier circuit 10 controls a gate terminal of the PMOS transistor 21 in such a manner that a reference voltage Vref supplied to the input terminal 3 and an output voltage Vout of the output terminal 4 become equal. Based on the voltage Vout of the output terminal of the voltage regulator 100 which is supplied to the ground fault detection circuit 30 the ground fault detection circuit 30 outputs a ground fault detection signal GF from a drain terminal of the NMOS transistor 33 and outputs a ground fault non-detection signal GFX from a gate terminal of the NMOS transistor 33. Based on the voltage Vout of the output terminal of the voltage regulator 100 which is supplied to the supply fault detection circuit 40 the supply fault detection circuit 40 outputs a supply fault detection signal SF from an output terminal of the NOT circuit 46 and outputs a supply fault non-detection signal SFX from an input terminal of the NOT circuit 46. Each of the switches SW11 through SW14 is turned off (opened) when a signal of a low level is supplied to the control terminal thereof and is turned on (closed) when a signal of a high level is supplied to the control terminal thereof.

The connection of the voltage regulator 100 according to the first embodiment will next be described.

In the error amplifier circuit 10, the input terminal 3 is connected via the switch SW12 to a gate terminal of the NMOS transistor 11 which serves as a first input terminal of the error amplifier circuit 10. The output terminal 4 is connected via the switch SW11 to a gate terminal of the NMOS transistor 12 which serves as a second input terminal thereof. A drain terminal of the NMOS transistor 11 which serves as an output terminal of the error amplifier circuit 10 is connected to the gate terminal of the PMOS transistor 21. The PMOS transistor 21 has a source terminal connected to the power supply terminal 1, and a drain terminal connected to the output terminal 4. The ground fault detection circuit 30 has an input terminal connected with the output terminal 4, a first output terminal providing the ground fault detection signal GF which is connected to one input terminal of the OR circuit 52, and a second output terminal providing the ground fault non-detection signal GFX which is connected to one input terminal of the AND circuit 51. The supply fault detection circuit 40 has an input terminal connected with the output terminal 4, a first output terminal providing the supply fault detection signal SF which is connected to the other input terminal of the OR circuit 52, and a second output terminal providing the supply fault non-detection signal SFX which is connected to the other input terminal of the AND circuit 51. The AND circuit 51 outputs a short fault non-detection signal FDX from an output terminal thereof. The OR circuit 52 outputs a short fault detection signal FD from an output terminal thereof.

The control terminals of the switches SW11 and SW12 are connected with the output terminal of the AND circuit 51. The switch SW13 is connected between the first and second input terminals of the error amplifier circuit 10 and has the control terminal connected with the output terminal of the OR circuit 52.

The current source 53 is connected between the gate terminal of the PMOS transistor 21 and the ground terminal 2 through the switch SW14. The control terminal of the switch SW14 is connected with the output terminal of the ground fault detection circuit 30. The current source 53 and the switch SW14 constructs a start-up circuit for returning from a ground fault detection state which is not sorted as a ground fault.

The operation of the voltage regulator 100 constructed as described above will be described.

When the voltage regulator 100 is in the normal condition at which a power supply voltage Vdd is applied to the power supply terminal 1, the error amplifier circuit 10 controls a gate voltage of the PMOS transistor 21 in such a manner that an output voltage Vout and an input voltage Vref become equal through comparison, thereby providing a constant output voltage Vout to the output terminal 4. At this time, the switch SW11 and the switch SW12 are turned on, and the switch SW13 and the switch SW14 are turned off.

A description will next be made of the operation where the output terminal 4 of the voltage regulator 100 is grounded due to a short fault in the load.

The output voltage Vout of the output terminal 4 lowers to a voltage level of the ground terminal 2 due to the ground fault.

The ground fault detection circuit 30 operates as described below to detect the ground fault of the output terminal 4.

When the voltage of the input terminal lowers, i.e., the voltage of a source terminal of the PMOS transistor 31 whose gate terminal is grounded lowers so that the PMOS transistor 31 becomes unable to turn on, the NMOS transistor 33 turns off by the current source 32. Thus, the ground fault detection circuit 30 outputs a ground fault detection signal GF of a high level by the current source 34 and outputs a ground fault non-detection signal GFX of a low level by the current source 32.

Further, when the voltage of the input terminal lowers, the PMOS transistor 42 turns off, and the NMOS transistor 45 turns off by the current source 43. The supply fault detection circuit 40 thus outputs a supply fault detection signal SF of a low level by the current source 44 and the NOT circuit 46, and outputs a supply fault non-detection signal SFX of a high level by the current source 44.

Since the ground fault non-detection signal GFX of the low level is supplied to the AND circuit 51, the AND circuit 51 outputs a short fault non-detection signal FDX of a low level from the output terminal. Since the ground fault detection signal GF of the high level is supplied to the OR circuit 52, the OR circuit 52 outputs a short fault detection signal FD of a high level from the output terminal.

The switches SW11 and SW12 are turned off by the short fault non-detection signal FDX of the low level. Thus, the gate terminal of the NMOS transistor 11 is separated from the input terminal 3, and the gate terminal of the NMOS transistor 12 is separated from the output terminal 4. The switch SW13 is turned on by the short fault detection signal FD of the high level. Thus, the gate terminal of the NMOS transistor 11 and the gate terminal of the NMOS transistor 12 are short-circuited. Further, the switch SW14 is turned on by the ground fault detection signal GF of the high level. Thus, the gate terminal of the PMOS transistor 21 is connected to the ground terminal 2 through the current source 53.

Being controlled as described above, it is possible to prevent deterioration in performance due to bias temperature instability even in the case where the output terminal 4 is in the ground fault state since the gate terminal of the NMOS transistor 11 and the gate terminal of the NMOS transistor 12 both of which serve as the differential input pair of the error amplifier circuit 10 are always applied with the equal voltage.

Incidentally, although the ground fault state of the output terminal 4 causes an overcurrent state of the drain current of the PMOS transistor 21 is, the gate terminal of the PMOS transistor 21 is controlled to make a desired drain current to flow therethrough by an unillustrated overcurrent protection circuit. At this time, the current source 53 pulls down the gate terminal of the PMOS transistor 21 to the ground terminal 2 to the extent that no bad influence is given to the control of the overcurrent protection circuit.

The operation of the voltage regulator 100 at the time of start-up will next be described.

Although the voltage regulator 100 starts up when the power supply voltage Vdd is applied to the power supply terminal 1, the output voltage Vout at this time is almost the same as the voltage of the ground terminal 2 when the output terminal 4 is grounded due to the short fault in the load. Thus, since the input terminal is at the voltage of the ground terminal 2, the ground fault detection circuit 30 determines that the voltage regulator 100 is in a ground fault mode.

The ground fault detection circuit 30 and the supply fault detection circuit 40 respectively output a ground fault detection signal GF and a ground fault non-detection signal GFX, and a supply fault detection signal SF and a supply fault non-detection signal SFX, which are similar to those in the above-described ground fault state. Further, the AND circuit 51 and the OR circuit 52 also respectively output a short fault non-detection signal FDX and a short fault detection signal FD similar to the above.

Further, the switch SW11, the switch SW12, the switch SW13, and the switch SW14 are also controlled in the same manner. The gate terminal of the PMOS transistor 21 is pulled down to the ground terminal 2 by the current source 53. That is, since the PMOS transistor 21 is brought into an on state, the voltage of the output terminal 4 gradually rises.

When the voltage of the output terminal 4 gradually rises, and hence the voltage of the input terminal of the ground fault detection circuit 30 gradually rises to turn on the PMOS transistor 31, the NMOS transistor 33 is turned on to output a ground fault detection signal GF of a low level and a ground fault non-detection signal GFX of a high level. At this time, the supply fault detection circuit 40 does not detect a supply fault. Thus, since the short fault non-detection signal FD becomes a low level, and the short fault detection signal FDX becomes a high level, the switch SW11 and the switch SW12 are turned on, and the switch SW13 and the switch SW14 are turned off, so that the voltage regulator 100 is brought into a normal operation state, i.e., the voltage regulator 100 starts operation.

Thus, the voltage regulator 100 according to the present embodiment is capable of preventing deterioration of the performance due to the bias temperature instability without impairing the operation at the start-up by setting the gates of the MOS transistors being the input differential pair of the error amplifier circuit 10 to the same potential when the output terminal 4 is grounded due to the short fault in the load or the like.

Further, since the operation of the voltage regulator 100 where the output terminal 4 is subjected to the supply fault due to the short fault in the load or the like is also almost similar to the case of the above-described ground fault, its description will be omitted.

Second Embodiment

Figure 2:
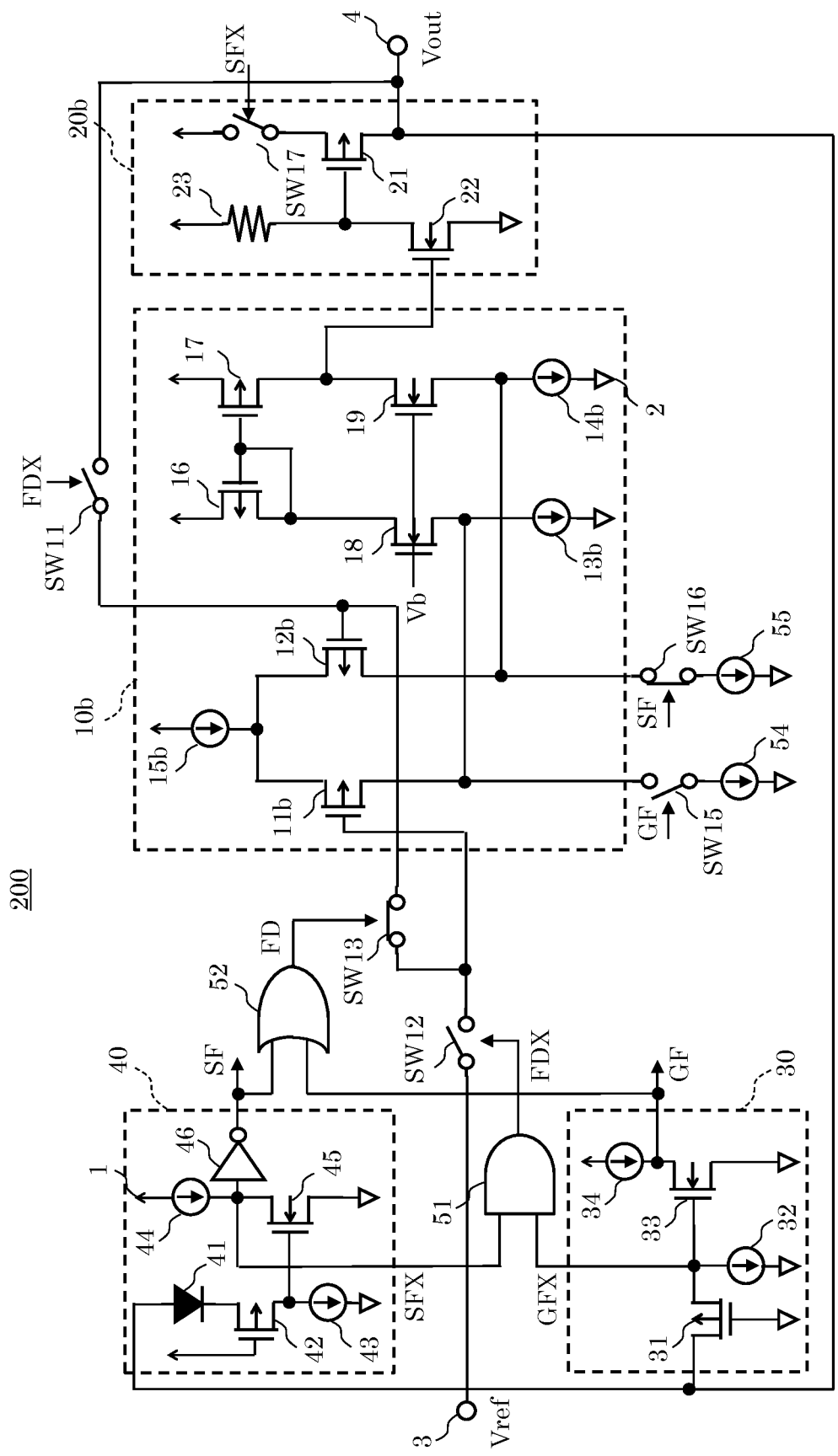
FIG. 2 is a circuit diagram illustrating a voltage regulator according to a second embodiment of the present invention.
Figure 3:
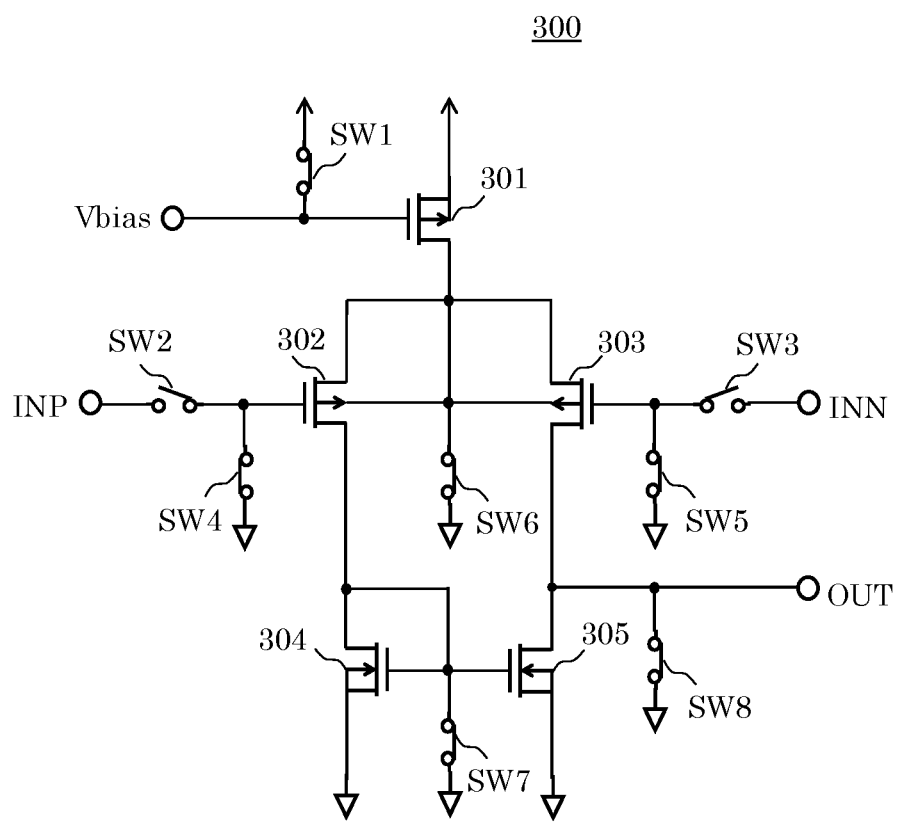
FIG. 3 is a circuit diagram of an error amplifier circuit used in a conventional voltage regulator.

A voltage regulator 200 according to a second embodiment will be described with reference to FIG. 2.

The voltage regulator 200 according to the present embodiment has a configuration in which the error amplifier circuit 10 and the output circuit 20 in the voltage regulator 100 according to the first embodiment are replaced by an error amplifier circuit 10b and an output circuit 20b, the switch SW14 and the current source 53 are deleted from the voltage regulator 100, and switches SW15 and SW16 and current sources 54 and 55 are added thereto.

Since the voltage regulator 200 is the same as the voltage regulator 100 of FIG. 1 in other part of the configuration, the same components are denoted by the same reference numerals, and their dual description will be omitted as appropriate.

The error amplifier circuit 10b includes PMOS transistors 11b and 12b being a differential input pair, current sources 13b, 14b, and 15b, PMOS transistors 16 and 17, and NMOS transistors 18 and 19 being cascode transistors having gate terminals applied with a bias voltage Vb. The output circuit 20b includes an NMOS transistor 22 and a resistor 23 which serves as a source grounded amplifier circuit, a PMOS transistor 21 being an output transistor, and a switch SW17.

The operation of the voltage regulator 200 according to the present embodiment will be described by paying attention to differences from the voltage regulator 100 according to the first embodiment.

When the output terminal 4 of the voltage regulator 200 is subjected to a ground fault due to a short fault in the load, the ground fault detection circuit 30 detects the ground fault of the output terminal 4 and outputs a ground fault detection signal GF of a high level and a ground fault non-detection signal GFX of a low level. Further, the supply fault detection circuit 40 outputs a supply fault detection signal SF of a low level and a supply fault non-detection signal SFX of a high level. Furthermore, the AND circuit 51 outputs a short fault non-detection signal FDX of a low level, and the OR circuit 52 outputs a short fault detection signal FD of a high level.

Since the switch SW11 and the switch SW12 are turned off and the switch SW13 is turned on in a manner similar to the first embodiment, the gate terminals of the MOS transistors being the input differential pair of the error amplifier circuit 10b are always applied with an equal voltage, thus making it possible to prevent deterioration of the performance due to bias temperature instability.

In the second embodiment, the switch SW15 is turned on, and the switch SW16 is turned off. With the turning on of the switch SW15, the error amplifier circuit 10b outputs a signal of a high level to a gate of the NMOS transistor 22 from the output terminal. Thus, since the NMOS transistor 22 is turned on, and the PMOS transistor 21 is turned on, the output circuit 20b does not impair the operation at the start-up of the voltage regulator.

A description will next be made of the operation when the output terminal 4 of the voltage regulator 200 is short-circuited to an external power supply having a voltage higher than the voltage of the power supply terminal 1.

The supply fault detection circuit 40 operates as described below to detect the supply fault of the output terminal 4.

An output voltage Vout of the output terminal 4 in the voltage regulator 200 rises to a voltage level higher than the voltage of the power supply terminal 1 due to the supply fault. When the output voltage Vout becomes equal to or higher than a sum of the voltages Vdd+VTP42+VF where VTP42 is a threshold voltage of the PMOS transistor 42 and VF is a forward voltage of a diode 41, the PMOS transistor 42 turns on. When a current flowing through the PMOS transistor 42 becomes equal to or larger than that of the constant current source 43 and a gate voltage of the NMOS transistor 45 becomes equal to or higher than a threshold voltage, the NMOS transistor 45 turns on. Thus, the supply fault detection circuit 40 outputs a supply fault detection signal SF of a high level and outputs a supply fault non-detection signal SFX of a low level.

As a result, since the switch SW11 and the switch SW12 are turned off, and the switch SW13 is turned on as with the time of the detection of the ground fault, the effect to the voltage regulator 200 is also similar to the above. Further, since at this time, the switch SW15 is turned off, and the switch SW16 is turned on, the error amplifier circuit 10b outputs a signal of a low level from the output terminal. Thus, in the output circuit 20b, the NMOS transistor turns off, and the PMOS transistor turns off. Further, since the switch SW17 is turned off, it is possible to prevent a reverse current from the output terminal 4 to the power supply terminal 1.

Accordingly, the gates of the MOS transistors being the input differential pair of the error amplifier circuit 10b are also set to the same potential in the voltage regulator 200 according to the present embodiment as with the first embodiment, thereby making it possible to prevent deterioration of the performance due to the bias temperature instability.

Although the embodiments of the present invention have been described above, the present invention is not limited to the above embodiments. It is needless to say that various changes can be made thereto within the scope not departing from the spirit of the present invention.

For example, the backflow prevention function provided in the output terminal 4 of the second embodiment may be applied to the first embodiment or may be deleted when it is not required.

Also, for example, although the supply fault detection circuit 40 has the circuit configuration of detecting the voltage higher than the power supply voltage Vdd, the supply fault detection circuit 40 may be configured to detect a desired voltage value.

Further, for example, the gates of the MOS transistors being the input differential pair of the error amplifier circuit 10 may be pulled down by the current source so as not to float when the switch SW11 and the switch SW12 are turned off.

Furthermore, for example, only one of the ground fault detection circuit 30 and the supply fault detection circuit 40 may be provided based on a magnitude relationship between the power supply voltage Vdd, the reference voltage Vref, and the external power supply voltage connected to the output terminal 4.

Still further, for example, although the input terminal of the error amplifier circuit 10 has been described as being connected with the output terminal 4, an output terminal from a voltage division circuit dividing the output voltage Vout which is provided to the output terminal 4 may be connected to the input terminal.

What is claimed is:

1. A voltage regulator comprising:
an error amplifier circuit configured to control a gate voltage of an output transistor, based on a reference voltage supplied from an input terminal and an output voltage, the output transistor configured to generate the output voltage supplied from an output terminal;
a first switch connected between a first input terminal of the error amplifier circuit and the input terminal;
a second switch connected between a second input terminal of the error amplifier circuit and the output terminal;
a third switch connected between the first input terminal and the second input terminal; and
a short fault detection circuit configured to detect a short fault of the output terminal, based on the output voltage, and output a short fault detection signal indicating the existence of the short fault of the output terminal in response to detecting the short fault of the output terminal;
wherein the first switch and the second switch are configured to open in response to and for a duration of the short fault detection signal indicating the existence of the short fault of the output terminal, and wherein the third switch is configured to close in response to and for a duration of the short fault detection signal indicating the existence of the short fault of the output terminal.

2. The voltage regulator according to claim 1, wherein the short fault detection circuit detects a ground fault of the output terminal.

3. The voltage regulator according to claim 1, wherein the short fault detection circuit detects a supply fault of the output terminal.

4. The voltage regulator according to claim 2, further comprising a start-up circuit operating in response to a ground fault detection signal generated in response to detecting the ground fault of the output terminal by the short fault detection circuit.

5. The voltage regulator according to claim 2, wherein the short fault detection circuit detects a supply fault of the output terminal.

6. The voltage regulator according to claim 4, wherein the short fault detection circuit detects a supply fault of the output terminal.

* * * * *